United States Patent [19]
Cline et al.

[11] 3,956,024
[45] May 11, 1976

[54] PROCESS FOR MAKING A SEMICONDUCTOR VARISTOR EMBODYING A LAMELLAR STRUCTURE

[75] Inventors: Harvey E. Cline; Thomas R. Anthony, both of Schenectady, N.Y.

[73] Assignee: General Electric Company, Schenectady, N.Y.

[22] Filed: Nov. 29, 1974

[21] Appl. No.: 528,253

Related U.S. Application Data

[62] Division of Ser. No. 411,016, Oct. 30, 1973, abandoned.

[52] U.S. Cl. .................. 148/1.5; 148/171; 148/172; 148/177; 148/179; 252/62.3 GA; 252/62.3 E; 357/76
[51] Int. Cl.² ..................... H01L 7/34; H01L 7/00
[58] Field of Search ........... 148/1.5, 171, 172, 173, 148/177, 179; 252/62.3 GA, 62.3 E; 75/65 ZM; 357/76

[56] References Cited
UNITED STATES PATENTS

| | | |
|---|---|---|
| 2,813,048 | 11/1957 | Pfann ............................. 148/1 |
| 3,205,101 | 9/1965 | Mlavsky et al ..................... 148/171 |
| 3,484,302 | 12/1969 | Maeda et al ...................... 148/1.5 |
| 3,503,125 | 3/1970 | Haberecht ..................... 148/187 X |

*Primary Examiner*—G. Ozaki
*Attorney, Agent, or Firm*—Donald M. Winegar; Joseph T. Cohen; Jerome C. Squillaro

[57] ABSTRACT

A varistor has a lamellar structured body of semiconductor material. The lamellar structure is produced by migrating "wires" of metal by a temperature gradient zone melting process to form a plurality of alternate regions of opposite type conductivity in a substrate and a P-N junction at the contiguous surfaces of each pair of regions of opposite type conductivity. The material of the regions formed by the migrated wires is recrystallized semiconductor material of the body suitably doped to form a selected type conductivity and resistivity.

8 Claims, 6 Drawing Figures

PROCESS FOR MAKING A SEMICONDUCTOR VARISTOR EMBODYING A LAMELLAR STRUCTURE

This is a division of application Ser. No. 411,016, filed Oct. 30, 1973, now abandoned.

BACKGROUND OF THE INVENTION

1. Field of the Invention

This invention relates to semiconductor varistors and a method of making the same.

2. Description of the Prior Art

Varistors are nonlinear resistive elements commonly used to protect electrical circuits or electrical apparatus from high voltage surges. In particular, it is often desirable to protect power lines from high voltage surges to protect the transformers, insulators and electrical equipment associated therewith. One type of prior art varistor embodies a polycrystalline material such, for example, as a zinc oxide-bismuth oxide combination. However, it has been discovered that materials such as this combination experience an increase in leakage current with the passage of time. One could use a plurality of several connected back-to-back Zener diodes but the economics of such a system is prohibited. Additionally, each electrical connection is a potential source of failure particularly if a sound electrical connection has not resulted from the joining operation.

An object of this invention is to provide a new and improved semiconductor varistor which corrects the deficiencies of the prior art devices.

Another object of this invention is to provide a new and improved semiconductor varistor having a lamellar structure including spaced regions of recrystallized substrate material.

Another object of this invention is to provide a new and improved semiconductor varistor having a lamellar structure including spaced regions of recrystallized substrate material having a substantially uniform dopant impurity concentration through the regions.

Other objects of this invention will, in part, be obvious and will, in part, appear hereinafter.

In accordance with the teachings of this invention there is provided a semiconductor varistor comprising a body of semiconductor material having a lamellar structure of a plurality of integral diodes arranged in a series circuit. Each diode has first and second regions of different and opposite type conductivity. The first region has a first type conductivity and a selected resistivity. The second region has recrystallized material of the first region including a sufficient quantity of a dopant material to impart a second and the opposite conductivity type thereto. A first P-N junction is formed by the contiguous surfaces of each pair of first and second regions of opposite type conductivity of each diode. A second P-N junction is formed by the contiguous surfaces of each pair of regions of opposite type conductivity of each pair of mutually adjacent integral diodes which are in abutting contact with each other. The varistor has an inherent physical characteristic to break down and conduct an electrical current upon the application of a selected voltage across the P-N junction of the lamellar body.

DESCRIPTION OF THE INVENTION

Figure 1:
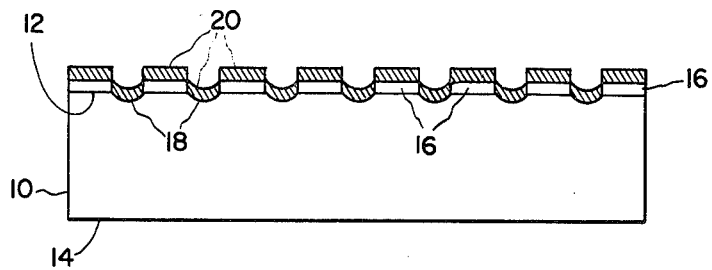
FIGS. 1, 2 and 3 are elevation views of a body of semiconductor material processed in accordance with the teachings of this invention.

With reference to FIG. 1, there is shown a body 10 of semiconductor material having a selected resistivity and a first type conductivity. The body 10 has opposed major surfaces 12 and 14 which are the top and bottom surfaces respectively thereof. The semiconductor material comprising the body 10 may be silicon, germanium, silicon carbide, gallium arsenide, a compound of a Group II element and a Group VI element, and a compound of a Group III element and a Group V element.

The body 10 is mechanically polished, chemically etched to remove any damaged surfaces, rinsed in deionized water and dried in air. An acid resistant mask 16 is disposed on the surface 12 of the body 10. Preferably the mask is of silicon oxide which is either thermally grown or vapor deposited on the surface 12 by any of the methods well known to those skilled in the art. Employing well known photolithographical techniques, a photoresist, such, for example, as Kodak Metal Etch Resist, is disposed on the surface of the silicon oxide layer 16. The resist is dried by baking at a temperature of about 80°C. A suitable mask of spaced lines of a predetermined thickness and spaced a predetermined distance apart is disposed on the layer of photoresist and exposed to ultraviolet light. After exposure, the layer of photoresist is washed in xylene to open windows in the mask where the lines are desired so as to be able to selectively etch the silicon oxide layer 16 exposed in the windows.

Selective etching of the layer 16 of silicon oxide is accomplished with a buffered hydrofluoric acid solution ($NH_4F$—HF). The etching is continued until a second set of windows corresponding to the windows of the photoresist mask is opened in the layer 16 of silicon oxide to expose selective portions of the surface 12 of the body 10 of silicon. The processed body 10 is rinsed in deionized water and dried. The remainder of the photoresist mask is removed by immersion in concentrated sulphuric acid at 180°C or immersion in a mixture of 1 part by volume hydrogen peroxide and 1 part by volume concentrated sulphuric acid.

Selective etching of the exposed surface of areas of the body 10 is accomplished with a mixed acid solution. The mixed acid solution is 10 parts by volume nitric acid, 70%, 4 parts by volume acetic acid, 100%, and 1 part by volume hydrofluoric acid, 48%. At a temperature of from 20°C to 30°C, the mixed acid solution selectively etches the silicon of the body 10 at a rate of approximately 5 microns per minute. A trough 18 is etched in the surface 12 of the body 10 beneath each window of the oxide layer 16. The selective etching is continued until the depth of the trough 18 is approximately equal to the width of the window in the silicon oxide layer 16. However, it has been discovered, that the trough 18 should not be greater than approximately 25 microns in depth because undercutting of the silicon oxide layer 16 will occur. Undercutting of the layer 16 of silicon oxide has a detrimental effect on the width of the device to be migrated through the body 10. Etching for approximately 5 minutes at a temperature of 25°C will result in a trough 18 of from 25 to 30 microns in depth for a window width of from 10 to 500 microns. The etched body 10 is rinsed in distilled water and blown dry. Preferably, a gas such, for example as, freon, argon and the like, is suitable for drying the processed body 10.

The processed body 10 is disposed in a metal evaporation chamber. A metal layer 20 is deposited on the remaining portions of the layer 16 of silicon oxide and on the exposed silicon in the troughs 18. The metal in the troughs 18 are the metal "wires" to be migrated through the body 10. The metal of the layer 20 comprises a material, either substantially pure in itself or suitably doped by one or more materials to impart a second and opposite type conductivity to the materials of the body 10 through which it migrates. The thickness of the layer 20 is approximately equal to the depth of the trough 18. Therefore, if the trough 18 is 20 microns deep, the layer 20 is approximately 20 microns in thickness. A suitable material for the metal layer 20 is aluminum to obtain P-type regions in N-type silicon semiconductor material. Prior to migrating the metal wires in the troughs 18 through the body of silicon 10, the excess metal of the layer 20 is removed from the silicon oxide layer 16 by such suitable means as grinding away the excess metal with a 600 grit carbide paper.

It has been discovered that the vapor deposition of the layer 20 of aluminum metal should be performed at a pressure of approximately $1 \times 10^{-5}$ torr but not greater than $3 \times 10^{-5}$ torr. When the pressure is greater than $3 \times 10^{-5}$ torr, we have found that in the case of aluminum metal deposited in the trough 18, the aluminum does not penetrate into the silicon and migrate through the body 10. It is believed that the layer of aluminum is saturated with oxygen and prevents good wetting of the contiguous surfaces of silicon. The initial melt of aluminum and silicon required for migration is not obtained because of the inability of aluminum atoms to diffuse into the silicon interface. In a like manner, aluminum deposited by sputtering is not desirable as the aluminum appears to be saturated with oxygen from the process. The preferred methods of depositing aluminum on the silicon body 10 are by the electron beam method and the like wherein little if any oxygen can be trapped in the aluminum.

The processed body 10 is placed in a thermal migration apparatus, not shown, and the metal wires in the troughs 18 are migrated through the body 10 by a thermal gradient zone melting process. A thermal gradient of approximately 50°C per centimeter between the bottom surface 14, which is the hot face, and the surface 12, which is the cold face, has been discovered to be appropriate at an apparatus operating temperature of from 800°C to 1400°C. The process is practiced for a sufficient length of time to migrate all the metal wires through the body 10. For example, for aluminum wires of 20 microns thickness, a thermal gradient of 50°C/cm at 1200°C apparatus temperature at a pressure of $1 \times 10^{-5}$ torr, a furnace time of less than 12 hours is required to migrate the wires through a silicon body 10 of 1 centimeter thickness.

The temperature gradient zone melting process and apparatus therefore is not a part of this invention. For a more thorough understanding of the temperature gradient zone melting process and the apparatus employed for the process, one is directed to our following copending applications filed concurrently with this patent application and assigned to the same assignee of this invention:

High Velocity Thermal Migration Method of Making Deep Diode Devices, U.S. Pat. No. 3,901,736;
Deep Diode Device Having Dislocation Free P-N Junctions And Method, Ser. No. 411,021;
Deep Diode Devices and Method And Apparatus, Ser. No. 411,001, now abandoned in favor of Ser. No. 552,154;
Deep Diode Array Produced By Thermomigration of Liquid Droplets, U.S. Pat. No. 3,898,106;
Large Scale Thermomigration Process, U.S. Pat. No. 3,902,925; and
The Stabilized Droplet Migration Method of Making Deep Diodes Having Uniform Electrical Properties, U.S. Pat. No. 3,899,361.

Figure 2:
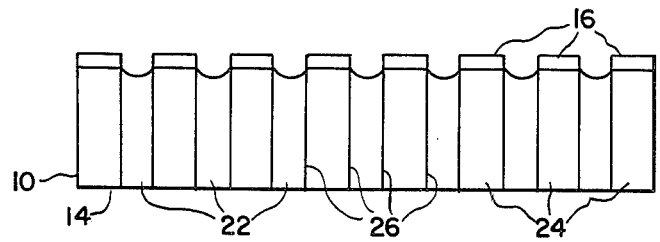

Upon completion of the temperature gradient zone melting process the resulting processed body 10 is as shown in FIG. 2. The thermal migration of the metal wires in the troughs 18 through the body 10 produces a body 10 having a lamellar structure of a plurality of first spaced regions 22 of a second and opposite type conductivity than the body 10. Each region 22 is recrystallized material of the body 10 suitably doped with a material comprising the metal wires and having an impurity concentration sufficient to obtain the desired conductivity. The metal retained in the recrystallized region is substantially the maximum allowed by the solid solubility in the semiconductor material. It is a semiconductor material with maximum solid solubility of the impurity therein. It is not semiconductor material which has liquid solubility of the material. Neither is it a semiconductor material which has eutectic material therein. The region 22 has a constant uniform level of impurity concentration throughout the entire planar region. The thickness of the region 22 is substantially constant for the entire region. The peripheral surface of each planar region 22 comprises in part the top surface 12, the bottom surface 14 and the peripheral side surface of the body 10.

Additionally, the body 10 is divided into a plurality of spaced regions 24 having the same, or first, type conductivity as the body 10. A P-N junction 26 is formed by the contiguous surfaces of each pair of mutually adjacent regions 22 and 24 of opposite type conductivity. The P-N junction 26, as formed, is very abrupt and distinct resulting in a stepped junction. The P-N junction 26 may be linearly graded by a post-thermomigration anneal if desired.

Figure 3:
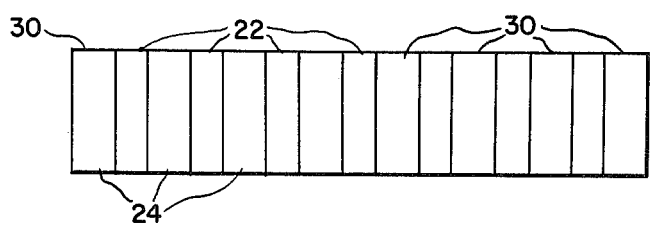

The resulting lamellar structure is a large area multiple planar region of alternate type conductivity as shown in FIG. 3. It is a plurality of integral diodes 30, each diode comprising two regions 22 and 24 of opposite type conductivity. The integral diodes 30 are arranged in a series electrical circuit. The structure may also be divided into a plurality of chips having a similar configuration.

Figure 4:
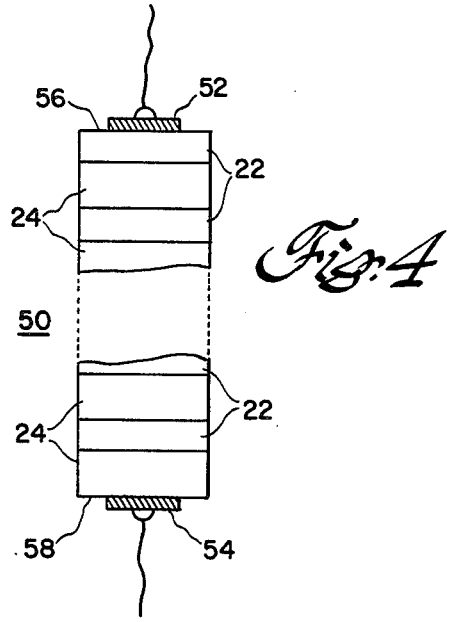
FIG. 4 is a semiconductor varistor made in accordance with the teachings of this invention.

Referring now to FIG. 4, there is shown a varistor 50 embodying the processed body 10 and its lamellar structure. Those items denoted by the same reference numbers are the same as, and function in the same manner as, the corresponding items of FIGS. 2 and 3. Electrical contacts 52 and 54 are affixed to respective opposed major surfaces 56 and 58 of the varistor 50.

The varistor 50 embodying the lamellar structure made by the temperature gradient zone melting process has many advantages over the prior art devices at moderate power levels of the order of 0.1 to 10 watts. Among these advantages are a rapid response to increasing, postitive or negative, application of voltage, a stable operating behavior and a more precise control of voltage. In comparison to prior art devices embodying series circuit connected diodes the varistor 50 proves to be less expensive. In addition, the separate physical electrical connection between each series connected diode, which is a potential source of failure because of an open electrical joint and/or a high resistance joint occurring, is eliminated by the lamellar structure of the varistor 50 which in essence is a single packaged device. In comparison to prior art devices embodying polycrystalline material, the varistor 50 has a sharper break down. In addition, the varistor 50 has a long term inherent physical characteristic stability since the lamellar structure comprises a plurality of P-N junctions in a body of semiconductor material. In comparison to prior art devices embodying epitaxially grown material, the varistor of this invention has P-N junctions formed by the migration of suitable "wires" which produce substantially clean, sharp P-N junctions. High temperature processing is avoided and the lifetime of the substrate material is maintained.

To illustrate the excellent electrical characteristics of the varistor of this invention, a body of N-type silicon having 10 ohm-centimeter resistivity and a carrier concentration of $5 \times 10^{14}$ atoms per cubic centimeter was processed in accordance with the body 10 relative to FIGS. 1 through 3. The regions 22 were formed by the temperature gradient zone melting process of migrating aluminum "wires" through the silicon body. Each region 22 was P-type conductivity recrystallized semiconductor material of the body and had a carrier concentration of $2 \times 10^{19}$ atoms per cubic centimeter and a resistivity of $8 \times 10^{-3}$ ohm-centimeter. The resulting lamellar structure had regions 22 and 24 each 13 mils or 325 microns in thickness.

Figure 5:
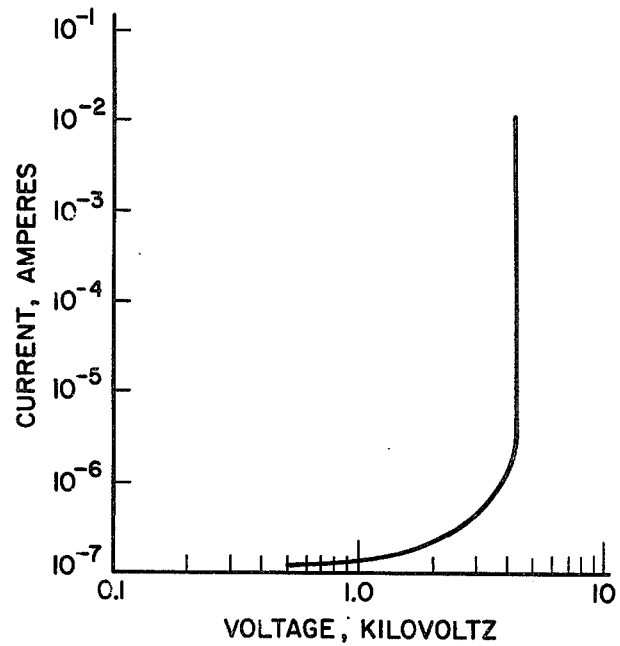
FIG. 5 is a graph of current versus voltage of the semiconductor varistor of FIG. 4.

A varistor measuring 0.6 centimeter in length, 1 centimeter in width and 0.2 centimeter in thickness was prepared from the above processed body. The varistor had 10 P-N junctions. The break down voltage of the varistor was 4,500 volts. A graph of the current in amperes versus the applied positive voltage in kilovolts is shown in FIG. 5.

The varistor showed excellent electrical characteristics for employment in electrical circuits to protect electrical equipment from over voltages. The resistivity throughout the N and P regions was substantially constant for the overall region. The processed body exhibited substantially theoretical physical values for the material utilized. The varistor was sectioned, mounted and examined. The P-N junctions were sharply defined and each one had a concentration profile about 0.3 micron in width. It is believed that the thermal gradient zone melting improves the P-N junction characteristics in that contaminants in the semiconductor materials of the body are gathered and removed from the body in much the same manner as in zone refining techniques. In prior art techniques embodying diffusion, alloying and epitaxial growth, the contaminants of the materials employed and/or produced thereby remain on the surface of the wafer being processed and/or become entrapped within the material thereby degrading its electrical characteristics.

Figure 6:
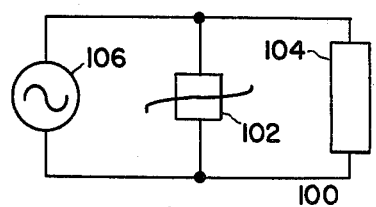
FIG. 6 is an electrical circuit embodying the semiconductor varistor of FIG. 4.

FIG. 6 illustrates a simple electrical circuit arrangement 100 embodying the varistor 102 of this invention. The varistor 102 is connected in a parallel circuit arrangement with electrical equipment 104 which is to be protected against over voltages. The varistor 102 is designed to conduct and short out the circuit to the equipment 104 when a specified voltage in the circuit occurs. The specified voltage is a selected increment beneath that which the equipment 104 can safely endure without failure. An electrical power source 106 supplies the power to the circuit 100 and impresses the voltage across the varistor 102 and electrical equipment 104.

The varistor of this invention is particularly useful in applications for automobiles and television receivers. In particular, the migration of an aluminum wire through N-type silicon having a resistivity of 0.01 ohm-centimeter produces a diode having a Zener break down of approximately 4 volts. A lamellar varistor incorporating regions formed by the migration of 10 aluminum wires by the thermal gradient zone melting process enables one to manufacture a voltage regulator of approximately 40 volts and still having Zener breakdown characteristics. Such a device made in accordance with the teachings of this invention has superior physical characteristics than prior art voltage regulators.

A low voltage automotive varistor is manufactured in accordance with the teachings of this invention by migrating six aluminum-rich liquid wires through $N^+$-type silicon having a resistivity of approximately 0.01 ohm-centimeter. The resulting varistor has a lamellar structure of 12 alternate $P^+$ and $N^+$-regions. Each pair of $P^+$ and $N^+$ regions encompasses a P-N junction having Zener characteristics. The Zener junction has a break over voltage of approximately 4 volts. The varistor, as made, has a capability of clamping at approximately 24 volts. The varistor of this invention is capable of operating in temperatures up to approximately 250°C and is greatly superior to prior art devices.

A high voltage clamp is possible embodying the lamellar structured varistor of this invention. Sixty aluminum wires are migrated by the temperature gradient zone melting process through a body of N-type silicon having a resistivity of 10 ohm-centimeter. Each P-N junction in the lamellar varistor break down at approximately 400 volts. The overall break down voltage for the device is in excess of 2400 volts and is suitable for use as a high voltage clamp in television receivers to prevent voltage spikes within the receivers from generating X-rays.

We claim as our invention:

1. A process for making a varistor comprising
   a. selecting a body of semiconductor material having a predetermined level of resistivity, a predetermined type conductivity and two major opposed surfaces which are, respectively, the top and bottom surfaces thereof;
   b. vapor depositing an array of metal wires having a selected configuration on a major surface of the body;
   c. heating the body and the array of metal wires to a predetermined elevated temperature sufficient to form an array of liquid wires of metal-rich semiconductor material on the surface of the body;
   d. establishing a temperature gradient in the body substantially perpendicular to the two opposed major surfaces, the major surface having the array of liquid wires being at the lower temperature;

e. migrating the array of liquid metal wires entirely through the body from the major surface of lower temperature to the major surface of high temperature;

f. forming a plurality of spaced regions of recrystallized semiconductor material of the body having solid solubility of the metal of the liquid wire therein, each region being formed by the migration of one particular liquid wire, the metal having at least one material therein of a predetermined level of concentration as determined by the temperature of migration to impart a predetermined level of resistivity and a predetermined type conductivity to the recrystallized material which is opposite to that type conductivity of the body thereby forming a plurality of P-N junctions substantially perpendicular to the major surfaces, each P-N junction being formed at the interface of each pair of abutting surfaces of semiconductor material of opposite type conductivity, and the spaced regions, in conjunction with the original material of the body, forming a plurality of integral regions of alternate and opposite type conductivity arranged in a series electrical circuit arrangement, and g. affixing two electrical contacts to the body wherein one contact is in electrical contact with a region of recrystallized material, the second contact is in electrical contact with a region of original semiconductor material of the body, and a predetermined number of regions of opposite type conductivity and the associated P-N junctions are biased by application of a source of electrical energy to the electrical contacts.

2. The process of claim 1 and further including an additional process step before affixing the contacts of heating the processed body to a predetermined elevated temperature, and holding the processed body at the predetermined elevated temperature for a predetermined period of time sufficient to grade each P-N junction by lateral diffusion with respect to the major opposed surfaces of the body.

3. The process of claim 1 including practicing the process step prior to vapor depositing the array of metal wires of selectively etching the surface of preferred orientation of the body of semiconductor material to form an array of trough-like depressions into which the metal wires are vapor deposited.

4. The process of claim 3 wherein the semiconductor material of the body is one selected from the group consisting of silicon, silicon carbide, gallium arsenide and germanium.

5. The process of claim 4 wherein the material of the body is silicon of N-type conductivity and the material of the metal wire is aluminum.

6. The process of claim 5 wherein the resistivity of the silicon and the first region is 0.01 ohm-centimeters, and the resistivity of the second region is $8 \times 10^{-3}$ ohm-centimeter.

7. The process of claim 5 wherein the resistivity of the silicon and the first region is 0.01 ohm-centimeter, and the resistivity of the second region is $8 \times 10^{-3}$ ohm-centimeter.

8. The process of claim 5 wherein the resistivity of the silicon and the first region is 10 ohm-centimeter, and the resistivity of the second region is $8 \times 10^{-3}$ ohm-centimeter.

* * * * *